United States Patent
Axelsson et al.

(10) Patent No.: US 7,251,519 B2
(45) Date of Patent: Jul. 31, 2007

(54) MR-METHOD FOR THE IN VIVO MEASUREMENT OF TEMPERATURE OR PH-VALUE BY MEANS OF A HYPERPOLARISED CONTRAST AGENT

(75) Inventors: Oskar Axelsson, Malmo (SE); Jan Henrik Ardenkjaer-Larsen, Malmo (SE); Sven Månsson, Malmo (SE); Stefan Petersson, Malmo (SE); Ib Leunbach, Malmo (SE)

(73) Assignee: GE Healthcare AS, Oslo (NO)

( * ) Notice: Subject to any disclaimer, the term of this patent is extended or adjusted under 35 U.S.C. 154(b) by 255 days.

(21) Appl. No.: 10/240,754

(22) PCT Filed: Apr. 12, 2001

(86) PCT No.: PCT/GB01/01685

§ 371 (c)(1),
(2), (4) Date: Oct. 11, 2002

(87) PCT Pub. No.: WO01/79875

PCT Pub. Date: Oct. 25, 2001

(65) Prior Publication Data

US 2003/0124732 A1    Jul. 3, 2003

(51) Int. Cl.
*A61B 5/05*    (2006.01)

(52) U.S. Cl. ............ 600/410; 600/407; 600/412; 600/420; 600/431; 324/307; 324/309

(58) Field of Classification Search ........ 324/300, 324/307–309, 315; 600/410, 412, 420, 431, 600/407; 424/9.3, 9.32, 9.36; 436/173
See application file for complete search history.

(56) References Cited

U.S. PATENT DOCUMENTS 6,453,188 B1 * 9/2002 Ardenkjaer-Larsen et al. ... 600/420
6,574,495 B1 * 6/2003 Golman et al. .............. 600/420

* cited by examiner

*Primary Examiner*—Brian L. Casler
*Assistant Examiner*—Baisakhi Roy
(74) *Attorney, Agent, or Firm*—Robert F. Chisholm

(57) ABSTRACT

The present invention provides a method of MR investigation of a sample, said method comprising: (i) nuclear spin polarizing a high T1 MR imaging agent which contains in its molecular structure at least two hyperpolarisable nuclei within the same molecule, the frequency difference between the two resonance lines from said nuclei, δυ, being dependent upon either the temperature or the pH of said sample; (ii) administering the nuclear spin polarized MR imaging agent to said sample; (iii) exposing said sample to a radiation at a frequency selected to excite nuclear spin transitions in said MR imaging agent; and (iv) detecting and manipulating magnetic resonance signals from said sample using a single-shot RARE acquisition sequence with shifted data acquisition.

20 Claims, 4 Drawing Sheets

MR-METHOD FOR THE IN VIVO MEASUREMENT OF TEMPERATURE OR PH-VALUE BY MEANS OF A HYPERPOLARISED CONTRAST AGENT

This application is a 371 of PCT/GB01/01685, filed Apr. 12, 2001, which is a continuation-in-part of U.S. provisional application 60/210,912, filed Jun. 12, 2000.

This invention relates to a method of magnetic resonance imaging (MRI).

MRI is a diagnostic technique that has become particularly attractive to physicians as it is noninvasive and does not involve exposing the patient under study to potentially harmful radiation such as X-rays.

Techniques have been developed which involve ex vivo nuclear spin polarisation of agents containing non zero nuclear spin nuclei (e.g. $^3$He), prior to administration and in vivo MR signal measurement. Some such techniques involve the use of polarising agents, for example conventional OMRI contrast agents or hyperpolarised gases to achieve ex vivo nuclear spin polarisation of non zero nuclear spin nuclei in an administrable MR imaging agent. By polarising agent is meant any agent suitable for performing ex vivo polarisation of an MR imaging agent.

MRI methods involving ex vivo nuclear spin polarisation may be improved by using nuclear spin polarised MR imaging agents comprising in their molecular structure nuclei capable of emitting MR signals in a uniform magnetic field (e.g. MR imaging nuclei such as $^{13}$C or $^{15}$N nuclei) and capable of exhibiting a long $T_1$ relaxation time, and preferably additionally a long $T_2$ relaxation time. Such agents are referred to hereinafter as "high $T_1$ agents". A high $T_1$ agent, a term which does not include $^1$H$_2$O, will generally be water-soluble and have a $T_1$ value of at least 6 seconds in D$_2$O at 37° C. and at a field of 7T, preferably 8 secs or more, more preferably 10 secs or more, especially preferably 15 secs or more, more especially preferably 30 secs or more, yet more especially preferably 70 secs or more, even yet more especially preferably 100 secs or more. Unless the MR imaging nucleus is the naturally most abundant isotope, the molecules of a high $T_1$ agent will preferably contain the MR imaging nucleus in an amount greater than its natural isotopic abundance (i.e. the agent will be "enriched" with said nuclei).

Hyperpolarisation of an active MR nucleus may be achieved in a variety of ways, for example by polarisation transfer from a noble gas, or by one of the following methods as described in earlier published applications of the present applicant; "brute force" (WO-A-99/35508), dynamic nuclear polarisation or DNP (WO-A-98/58272), parahydrogen or p-H$_2$ (WO-A-99/24080).

Furthermore, the use of hyperpolarised MR contrast agents in MR investigations such as MR imaging has the advantage over conventional MR techniques in that the nuclear polarisation to which the MR signal strength is proportional is essentially independent of the magnetic field strength in the MR apparatus. Currently the highest obtainable field strengths in MR imaging apparatus are about 8T, while clinical MR imaging apparatus are available with field strengths of about 0.2 to 1.5T. Since superconducting magnets and complex magnet construction are required for large cavity high field strength magnets, these are expensive. Using a hyperpolarised contrast agent, since the field strength is less critical it is possible to make images at all field strengths from earth field (40-50 µT) up to the highest achievable fields. However there are no particular advantages to using the very high field strengths where noise from the patient begins to dominate over electronic noise (generally at field strengths where the resonance frequency of the imaging nucleus is 1 to 20 MHz) and accordingly the use of hyperpolarised contrast agents opens the possibility of high performance imaging using low cost, low field strength magnets.

It has previously been found, see for example WO-A99/35508 (to Nycomed Imaging AS), that MR imaging agents (high $T_1$ agents) may be nuclear spin polarised in the solid state prior to being dissolved in a physiologically tolerable solvent and subsequently administered as a hyperpolarised solution to the sample under investigation. Furthermore, when the polarization is effected by means of a polarising agent, the whole, substantially the whole, or at least a portion of the polarising agent can be separated from the MR imaging agent prior to administration.

When the previously disclosed MR imaging agents (high $T_1$ agents) are administered to a sample and said sample is exposed to a radiation at a frequency selected to excite nuclear spin transitions in selected nuclei in the agent, then by detecting the magnetic resonance signals from the sample it is possible to generate an image, dynamic flow data, diffusion data, perfusion data, physiological data or metabolic data from said detected signals. Such physiological data can include temperature, pH, pO$_2$, pCO$_2$ and ionic concentration, preferably pH and temperature.

The methods previously described require the $B_o$-field inhomogeneity to be measured during the investigation of the sample (where $B_o$ is the primary magnetic field). It has now been found that if an MR imaging agent (a high $T_1$ agent) is chosen which contains two hyperpolarised nuclei within the same molecule each with a different sensibility to a parameter such as pH or temperature but preferably each being of the same type of MR imaging nuclei, then an "internal reference" will effectively exist for the phase shift, making it unnecessary for separate field-mapping scans, used to measure the $B_o$-field inhomogeneities, to be performed.

Thus viewed from one aspect the present invention provides a method of MR investigation of a sample, preferably of a human or non-human animal body (e.g. a mammalian, reptilian or avian body), said method comprising:

(i) nuclear spin polarising a MR imaging agent, wherein said agent is a high $T_1$ agent and contains in its molecular structure at least two hyperpolarisable nuclei of the same type of MR imaging nuclei within the same molecule, having similar signal amplitudes, and wherein the frequency difference between the two resonance lines from said nuclei, δυ, is dependent upon either the temperature, pH, pO$_2$, pCO$_2$ or ionic concentration of said sample;

(ii) administering the nuclear spin polarised MR imaging agent to said sample;

(iii) exposing said sample to a radiation at a frequency selected to excite nuclear spin transitions in selected nuclei therein;

(iv) detecting and manipulating magnetic resonance signals from said sample using a single-shot RARE acquisition sequence with shifted data acquisition, and wherein the excitation and detection steps iii) and iv) are such that said nuclei are all being excited and detected in the same sequence; and (v) optionally generating an image, dynamic flow data, diffusion data or physiological and/or metabolic data from said detected signals.

Thus the invention involves the sequential steps of nuclear spin polarizing (otherwise referred to herein as "hyperpolarising") an MR imaging agent containing in its molecular structure at least two hyperpolarisable nuclei of the same type of MR imaging nuclei within the same molecule, having similar signal amplitudes, and wherein the frequency difference between the two resonance lines from said nuclei, $\delta\upsilon$, is dependent upon either the temperature, pH, $pO_2$, $pCO_2$ or ionic concentration of said sample, administering the nuclear spin polarised MR imaging agent to a sample (preferably in solution but optionally as a finely divided particulate, and preferably in the absence of a portion of, more preferably substantially the whole of, the species involved in transferring the polarisation), preferably by bolus injection, and performing in vivo MR signal generation and measurement using a single-shot RARE-acquisition sequence with shifted data acquisition. The MR signals obtained in this way may be conveniently converted by conventional manipulations into 2-, 3- or 4-dimensional data including flow, diffusion, physiological or metabolic data.

By "hyperpolarised" we mean polarised to a level over that found at room temperature and 1T, preferably polarised to a polarisation degree in excess of 0.1%, more preferably 1%, even more preferably 10%.

By "physiologically tolerable solvent" we mean any solvent, solvent mixture or solution that is tolerated by the human or non-human animal body, e.g. water, aqueous solutions such as saline, perfluorocarbons, etc.

Preferably, the frequency difference noted in step (i) of the method of the present invention is greater than 0.5 Hz per K or per 0.1 pH unit, more preferably greater than 1 Hz per K or per 0.1 pH unit, yet more preferably greater than 2 Hz per K or per 0.1 pH unit, even more preferably greater than 5 Hz per K or per 0.1 pH unit, most preferably between 10 Hz and 50 Hz per K or per 0.1 pH unit.

The frequency difference is primarily sensitive to either temperature or pH, although small interferences between the two can never be totally avoided.

According to the present invention, polarisation may be achieved by use of a polarising agent. The species providing the nuclear spin polarisation to the MR imaging agent is preferably separated as thoroughly as possible from the MR imaging agent once the transfer of polarisation has taken place. Preferably at least 80% of the polarisation transferring material is removed, particularly preferably 90% or more, especially preferably 95% or more, most especially 99% or more.

In the separation step of the method of the invention, it is desirable to remove substantially the whole of the polarisation transfer agent from the composition (or at least to reduce it to physiologically tolerable levels) as rapidly as possible. Many physical and chemical separation or extraction techniques are known in the art and may be employed to effect rapid and efficient separation of the polarization transfer agent and MR imaging agent.

As noted above, the method according to the present invention can be used to provide physiological data (pH, $pO_2$, $pCO_2$, temperature or ionic concentrations), preferably pH and temperature data. Although such preferred data can be obtained via other more conventional methods, such other methods suffer from several drawbacks. Possible other methods (and their drawbacks compared to the method of the present invention) include:

variation of $M_o$-magnetisation, $T_1$-relaxation times or $T_2$-relaxation times (low sensitivity/measurement precision also low);

variation of diffusion coefficient (indirect method/diffusion coefficient may vary for reasons other than temperature changes/sensitive to sample motion);

localised spectroscopy measuring chemical shift (poor resolution/not suitable for temperature/pH mapping);

chemical shift imaging (poor resolution/time consuming data acquisition)

Earlier patents in this area mention the possibility of estimating temperatures by NMR (seer for example, U.S. Pat. No. 4,558,279, U.S. Pat. No. 5,207,222, U.S. Pat. No. 5,327,884, U.S. Pat. No. 5,378,987, U.S. Pat. No. 5,690,909 and WO-A-97/20193), estimating pH values by NMR (see, for example, U.S. Pat. No. 5,210,290 and U.S. Pat. No. 5,639,906) or both (see, for example, U.S. Pat. No. 0,095,124). However these earlier patents do not mention techniques as herein claimed where hyperpolarised MR imaging agents containing two hyperpolarisable nuclei are administered to a sample, followed by in vivo MR signal generation and measurement using a single-shot RARE-acquisition sequence.

Step (iv) of the method according to the present invention comprises a spin-echo sequence. For instance, the NMR-signal may arise from a substance showing two resonance lines, separated by a frequency difference $\delta\upsilon$ (see FIG. 1 of the accompanying drawings). When the resonance lines are of equal intensity, the relative phase shift of the lines can create either signal amplification or complete signal cancellation. This technique is known in clinical MRI as the "in-phase/out-of-phase" technique and is used in conjunction with gradient echo imaging, where the echo time (TE) controls the amount of dephasing.

The level of image contrast with the "in-phase/out-of-phase" technique depends on the relative phase between the two spin populations and not the absolute phase. Therefore there is no requirement to correct the images for $B_o$-inhomogeneities and/or motion of the sample. A further advantage of this technique is that the contrast is obtained via a single image and the method of the present invention is therefore not linked to cases of measuring a temperature change between two images.

Although, as stated above, there is no requirement to correct for $B_o$-inhomogeneities, gradient echo imaging in general suffers from a sensitivity to susceptibility variations, for example, in the abdomen or near the lungs. Such problems are particularly acute when using long echo times, as is necessary when separating NMR-lines with a small difference in frequency or small chemical shift, i.e. $\delta\upsilon$ is small. It has now been found that by using a spin echo sequence comprising a refocusing 180°-pulse alleviates the problems of sensitivity to susceptibility variations. Conventionally, a spin echo sequence could not be used for detecting the phase difference of two spin populations since the 180°-pulse rephases the spins and cancels any chemical shift effect. In such cases the data acquisition coincides with the spin echo. However, should the read-out gradient and data acquisition be displaced by a time $\tau$ relative to the spin echo, then the spin echo sequence can still be used to detect the relative phase difference.

A single-shot RARE-sequence where only a single 90° RF-pulse is used is utilised in a method according to the present invention (see FIG. 3 of the accompanying drawings). Indeed, when hyperpolarised substances are used, it is not possible to apply more than one 90°-pulse due to the fact that there is no recovery of longitudinal magnetisation. Therefore, the single-shot RARE sequence is fully compatible with the use of hyperpolarised substances in methods according to the present invention.

The single-shot RARE sequence, which is based on a standard RARE-sequence, will now be described in greater detail, the letters corresponding to those on FIG. 3 of the accompanying drawings.

A) Shifted Data Acquisition

The shift is given by parameter τ. This shift is a prerequisite for phase sensitive imaging.

B) Single-Shot RARE-Acquisition

The single-shot technique enables the imaging of substances with very long $T_1$ times to be performed, e.g. $^{13}C$-imaging. The spin-echo technique described herein suppresses susceptibility artefacts.

C) Extra 180°-Pulse Without Data Acquisition

An extra 180°-pulse suppresses artefacts arising from stimulated echoes in combination with centred-phase encoding (see step D).

D) Centred-Phase Encoding

Minimises the influence of the gradual loss of phase coherence due to $T_2$-relaxation at long echo times.

E) Spin Preparation

Proton decoupling used together with, e.g. $^{13}C$ imaging, may give some improvements (due to sharper lines).

F) Flip Back

Restores part of the longitudinal magnetisation after a scan. This is particularly useful when the $T_1$-relaxation time is long and hence averaging over several scans is performed in order to increase the signal-to-noise ratio.

The novel modification in this sequence is the shifted data acquisition stage (A), which enables phase-sensitive signal detection. In standard RARE- or SE-sequences, the data acquisition is not shifted, i.e. data acquisition coincides with the spin echo. The sequence described above therefore forms a further aspect of the present invention.

Although the choice of a single-shot RARE sequence makes possible the imaging of hyperpolarised substances, the imaging principle itself does not itself require hyperpolarised nuclei to be present, and therefore the sequence forming a further aspect of the invention can be used to generate physiological data, particularly pH and temperature data, from any non-zero nuclei spin nuclei (e.g. $^1H$, $^3Li$, $^{13}C$ $^{15}N$ $^{19}F$, $^{29}Si$ or $^{31}P$)

Suitable MR imaging agents for use in the method of the present invention should satisfy the following criteria:

the agent should possess two resonance lines separated by a frequence difference δυ;

this frequency difference, δυ, should preferably be dependent on either the temperature or pH of the sample;

the signal amplitude from each of the two resonance lines should be similar, preferably equal; and the agent should exhibit a long $T_2$ relaxation time, preferably greater than 0.5 secs, more preferably greater than 1 sec, even more preferably than 5 secs.

Suitable MR imaging agents, high $T_1$ agents, may contain nuclei such as protons. However other non-zero nuclear spin nuclei may be useful (e.g. $^{19}F$, $^3Li$, $^{13}C$, $^{15}N$, $^{29}Si$ or $^{31}P$, as well as $^1H$), preferably $^1H$, $^{13}C$, $^{15}N$, $^{19}F$, $^{29}Si$ and $^{31}P$ nuclei, with $^{13}C$, $^{15}N$, $^{19}F$ and $^{31}P$ nuclei being particularly preferred. In this event the MR signals from which the image is generated may be substantially only from the MR imaging agent itself.

As noted above, $^1H$, $^{13}C$, $^{15}N$, $^{19}F$ and $^{31}P$ are the nuclei most suited to use in a method of the present invention. $^1H$ nuclei have the advantages of being present in high concentration in natural abundance and having the highest sensitivity of all nuclei. $^{13}C$ nuclei are advantageous as almost all the signal from such nuclei will be from the hyperpolarised resonance lines that are useful for generating physiological data, particularly temperature and pH data. The background signal from hyperpolarised $^{13}C$ nuclei is low and much less than from, for example, $^1H$ nuclei. $^{19}F$ nuclei have high sensitivity (88% of that from $^1H$ nuclei, for instance), a gyromagnetic ratio 94% that from $^1H$ and also gives no background signal.

Where the MR imaging nucleus is other than a proton (e.g. $^{13}C$, $^{19}F$ or $^{15}N$), there will be essentially no interference from background signals (the natural abundance of $^{13}C$ and $^{15}N$, for instance, being negligible) and image contrast will be advantageously high. This is especially true where the MR imaging agent itself is enriched above natural abundance in the MR imaging nucleus. Thus the method according to the invention has the benefit of being able to provide significant spatial weighting to a generated image.

In one embodiment, a "native image" of the sample (e.g. body) (i.e. one obtained prior to administration of the MR imaging agent or one obtained for the administered MR imaging agent without prior polarisation as in a conventional MR experiment) may be generated to provide structural (e.g. anatomical) information upon which the image obtained in the method according to the invention may be superimposed. A "native image" is generally not available where $^{13}C$ or $^{15}N$ is the imaging nucleus because of the low abundance of $^{13}C$ and $^{15}N$ in the body. In this case, a proton MR image may be taken to provide the anatomical information upon which the $^{13}C$ or $^{15}N$ image may be superimposed.

The MR imaging agent should of course be physiologically tolerable or be capable of being provided in a physiologically tolerable, administrable form where the sample is animate. Preferred MR imaging agents are soluble in aqueous media (e.g. water) and are of course non-toxic where the intended end use is in vivo.

Conveniently, the MR imaging agent once polarised will remain so for a period sufficiently long to allow the imaging procedure to be carried out in a comfortable time span. Generally sufficient polarisation will be retained by the MR imaging agent in its administrable form (e.g. in injection solution) if it has a $T_1$ value (at a field strength of 0.01-5T and a temperature in the range 20-40° C.) of at least 5s, more preferably at least 10s, especially preferably 30s or longer, more especially preferably 70s or more, yet more especially preferably 100s or more (for example at 37° C. in water at 1T and a concentration of at least 1 mM). The MR imaging agent may be advantageously an agent with a long $T_2$ relaxation time.

Alternatively, the $T_2$ valve may be sensitive to the physiological parameters of interest.

Solid MR imaging agents (e.g. $^{13}C$ or $^{15}N$ enriched solids) may exhibit very long $T_1$ relaxation times and for this reason are especially preferred for use in the present method.

For in vivo use, a polarised solid MR imaging agent is dissolved in administrable media (e.g. water or saline), administered to a subject and conventional MR imaging performed. Thus solid MR imaging agents are preferably rapidly soluble (e.g. water soluble) to assist in formulating administrable media. Preferably the MR imaging agent should dissolve in a physiologically tolerable carrier (e.g. water or Ringers solution) to a concentration of at least 1 mM at a rate of 1 mM/$3T_1$, or more, particularly preferably 1 mM/$2T_1$ or more, especially preferably 1 mM/$T_1$ or more. Where the solid MR imaging agent is frozen, the administrable medium may be heated, preferably to an extent such that the temperature of the medium after mixing is close to 37° C.

A polarised MR imaging agent may be administered (either alone or with additional components such as additional MR imaging agents) in liquid form. The retention of polarisation in a liquid medium vis-a-vis a gas medium is significantly greater. Thus while $T_1$ and $T_2$ are in general shorter for the liquid, the $T_2^*$ effect due to diffusion is $10^5$ times less significant for the liquid.

The MR imaging agent should be preferably enriched with nuclei (e.g. $^{15}N$ and/or $^{13}C$ nuclei) having a long $T_1$ relaxation time. Preferred are $^{13}C$ enriched MR imaging agents having $^{13}C$ at two particular positions (to about the same level of enrichment) in an amount in excess of the natural abundance, i.e. above about 1%. Preferably these carbon positions will have 5% or more $^{13}C$, particularly preferably 10% or more, especially preferably 25% or more, more especially preferably 50% or more, even more preferably in excess of 99% (e.g. 99.9%). The $^{13}C$ nuclei should preferably amount to >2% of all carbon atoms in the compound. The MR imaging agent is preferably $^{13}C$ enriched at carbonyl or quaternary carbon positions, given that a $^{13}C$ nucleus in a carbonyl group or in certain quaternary carbons may have a $T_1$ relaxation time typically of more than 2s, preferably more than 5s, especially preferably more than 30 s. Preferably the $^{13}C$ enriched compound should be deuterium labelled, especially adjacent the $^{13}C$ nucleus.

Preferred $^{13}C$ enriched compounds are those in which the $^{13}C$ nuclei are surrounded by one or more non-MR active nuclei such as O, S, C or a double bond.

Viewed from a further aspect, the present invention provides a method of MR investigation of a sample previously administered with a nuclear spin polarised MR imaging agent formed by nuclear spin polarising a MR imaging agent, wherein said agent is a high $T_1$ agent and contains in its molecular structure at least two hyperpolarisable nuclei of the same type of MR imaging nuclei within the same molecule having similar signal amplitudes, and wherein the frequency difference between the two resonance lines from said nuclei, $\delta\upsilon$, is dependent upon either the temperature, pH, $pO_2$, $pCO_2$ or ionic concentration of said sample, said method comprising:

i) exposing said sample to a radiation at a frequency selected to excite nuclear spin transitions in selected nuclei therein;

(ii) detecting and manipulating magnetic resonance signals from said sample using a single-shot RARE acquisition sequence with shifted data acquisition, and wherein the excitation and detection steps iii) and iv) are such that said nuclei are all being excited and detected in the same sequence; and (iii) optionally generating an image, dynamic flow data, diffusion data or physiological and/or metabolic data from said detected signals.

It is envisaged that, in the method according to the invention, the level of polarisation achieved should be sufficient to allow the hyperpolarised solution of the MR imaging agent to achieve a diagnostically effective contrast enhancement in the sample to which it is subsequently administered in whatever form. In general, it is desirable to achieve a degree of polarization which is at least a factor of 2 or more above the equilibrium value at the temperature and the magnetic field in which MRI is performed, preferably a factor of 10 or more, particularly preferably 100 or more and especially preferably 1000 or more, e.g 50000.

The MR imaging agents used in the method according to the invention may be conveniently formulated with conventional pharmaceutical or veterinary carriers or excipient B.

For use in in vivo imaging, the formulation, which preferably will be substantially isotonic, may conveniently be administered at a concentration sufficient to yield a 1 micromolar to 10M concentration of the MR imaging agent in the imaging zone; however the precise concentration and dosage will of course depend upon a range of factors such as toxicity, the organ targeting ability of the MR imaging agent and the administration route.

Parenterally administrable forms should of course be sterile and free from physiologically unacceptable agents, and should have low osmolality to minimize irritation or other adverse effects upon administration and thus the formulation should preferably be isotonic or slightly hypertonic.

Where the MR imaging agent is to be injected, it may be convenient to inject simultaneously at a series of administration sites such that a greater proportion of the vascular tree may be visualized before the polarization is lost through relaxation.

The dosages of the MR imaging agent used according to the method of the present invention will vary according to the precise nature of the MR imaging agents used, of the tissue or organ of interest and of the measuring apparatus. Preferably the dosage should be kept as low as possible while still achieving a detectable contrast effect. In general, the maximum dosage will depend on toxicity constraints.

The contents of all publications referred to herein are hereby incorporated by reference.

The invention is illustrated with reference to the following non-limiting Examples and the accompanying drawings in which:

FIG. 1 shows the NMR signal from a substance showing two resonance lines, separated by a frequency difference $\delta\upsilon$;

FIG. 2: [NOW DELETED]

EXAMPLE 1

Figure 1:
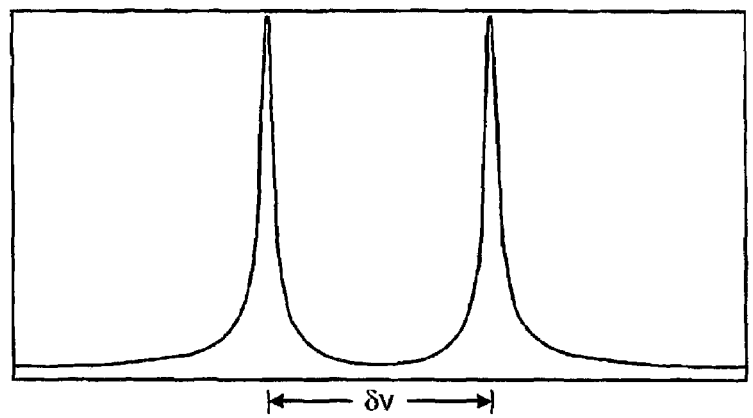
Figure 2:
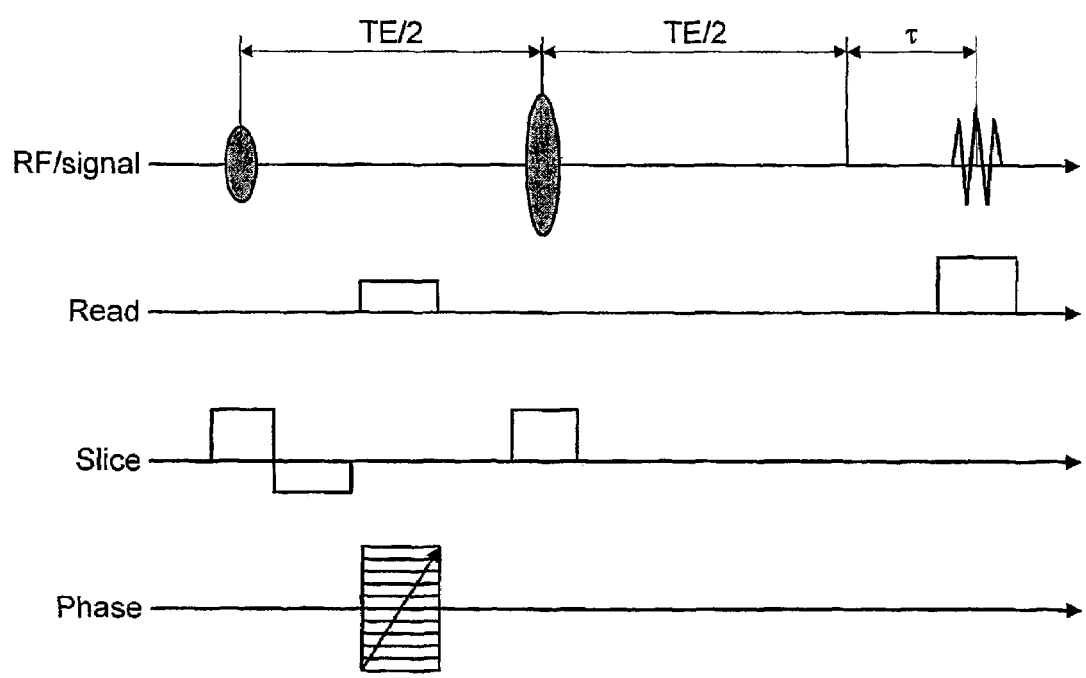
Figure 3:
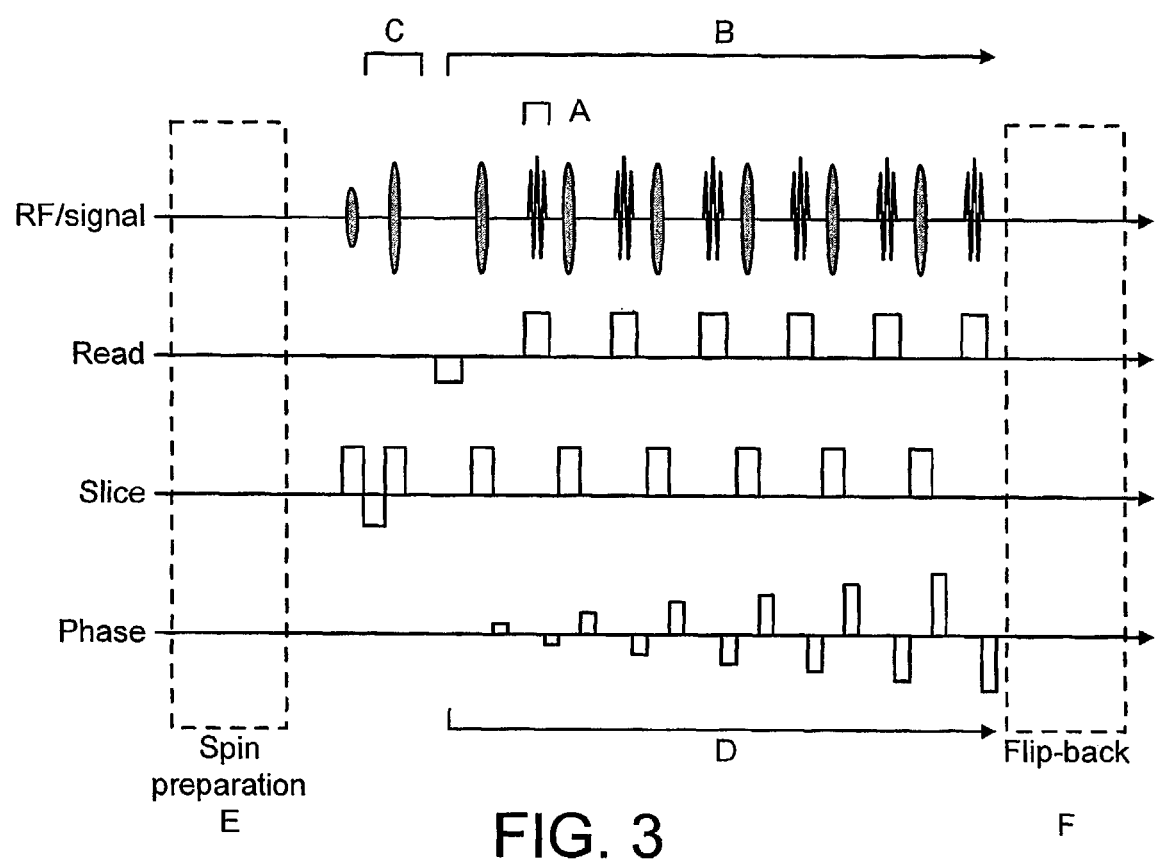
FIG. 3 shows a single-shot RARE-sequence for use in a method according to the present invention.
Figure 4:
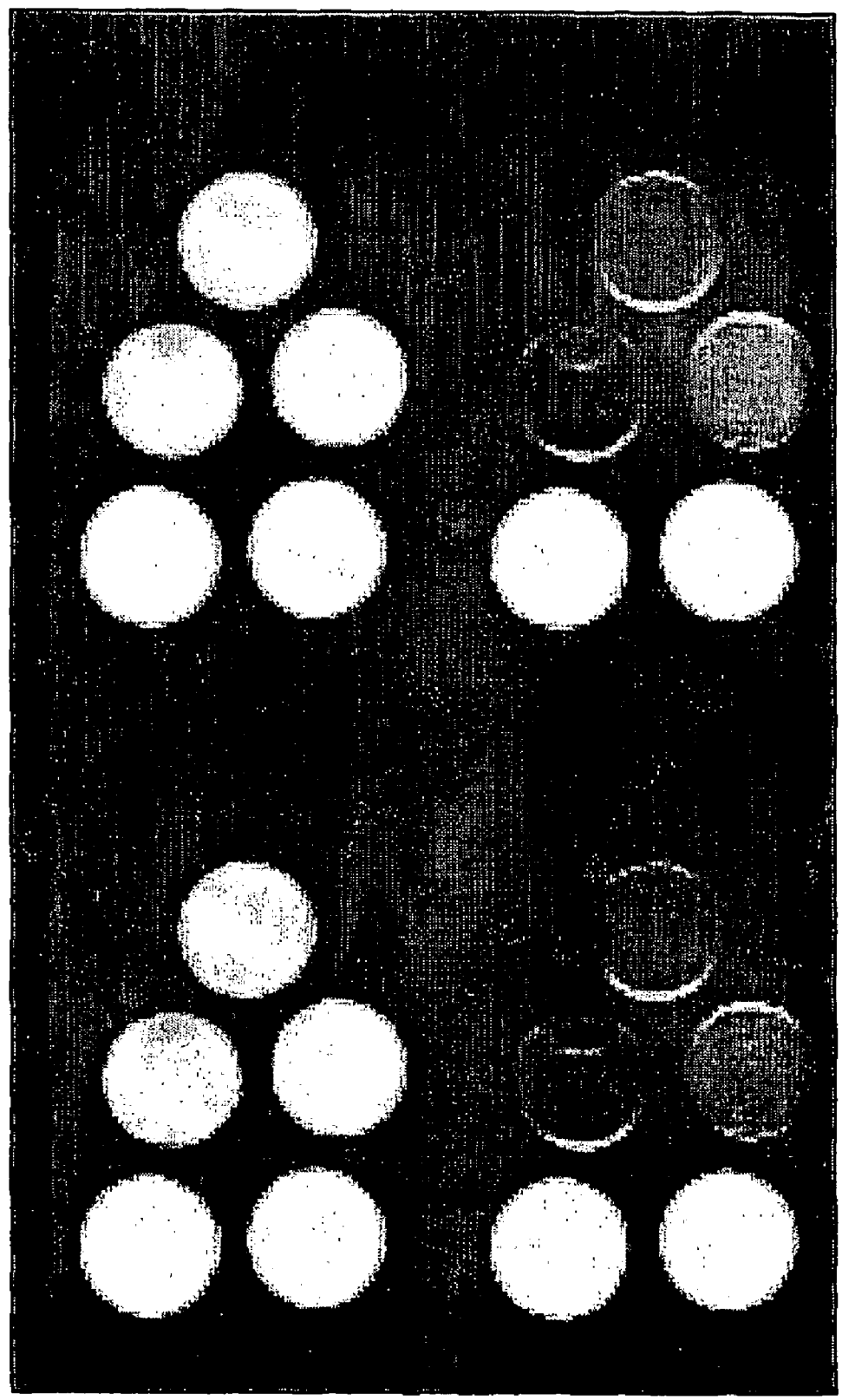
FIG. 4 shows some examples of phantom imaging on mixtures of water and acetic acid, using the RARE-sequence described in FIG. 3.

Phantom images were obtained from mixtures of water and acetic acid, using the RARE-sequence shown in FIG. 3. The images obtained are shown in FIG. 4. The top left images in FIG. 4 were produced using 16 averages and $\tau=10$ ms. The signal-to-noise ratio was 260 for a 1 minute scan time. All tubes have the same contrast. The top right images in FIG. 4 were produced using 16 averages and $\tau=1$ ms. The signal-to-noise ratio was 240 for a 1 minute scan time. The darkest tube contains 50% water:50% acetic acid and the signal from this tube was almost completely cancelled. The bottom left images in FIG. 4 were produced using a single-shot image (scan time 0.6 secs) and $\tau=0$ ms. The signal-to-noise ratio was 80. All tubes have the same contrast. The bottom right images in FIG. 4 were produced using a single-shot image (scan time 0.6 secs) and $\tau=1$ ms. The signal-to-noise ratio was 85 for a 1 minute scan time. The darkest tube contains 50% water:50% acetic acid.

EXAMPLE 2

Figure 5:
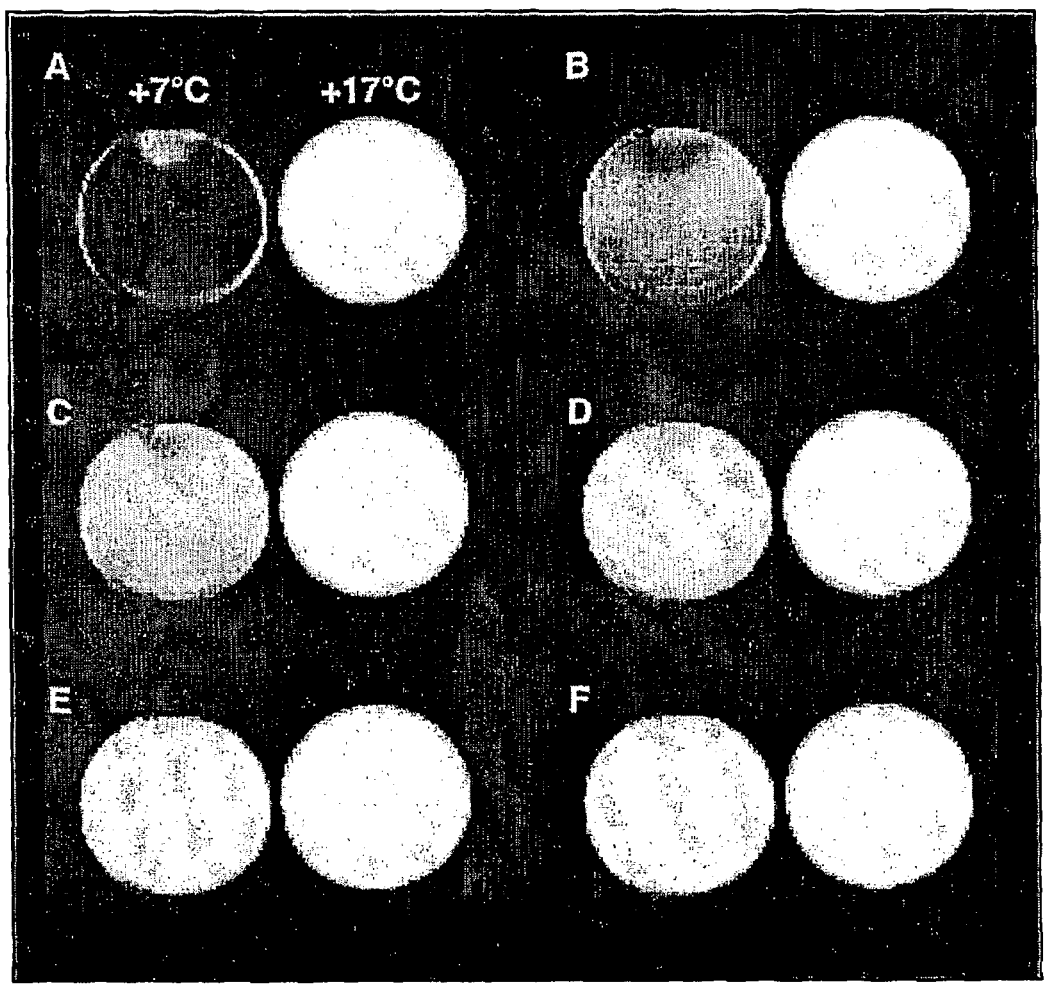
FIG. 5 shows examples of phantom images from cooled samples over time.

Two identical phantoms containing a mixture of 50% water:50% acetone were prepared. One phantom was placed inside the magnet at a constant temperature of 17° C., whilst the other was cooled to 7° C. The cooled phantom was then placed inside the magnet and imaging of the two phantoms was started 2 minutes after the second phantom was taken out of the cooler. FIG. 5A shows the cooled phantom to the left, with low intensity. FIGS. 5B-F were all acquired at consecutive 5 minute intervals, i.e. 7, 12, 17, 22 and 27 minutes after removal from the cooler, respectively. The right-hand phantom at constant temperature remains bright with a constant intensity throughout all images, whereas the intensity of the cooled phantom gradually increases as it gets warmer with time.

The invention claimed is:

1. A method of MR investigation of a sample, said method comprising:
   (i) nuclear spin polarising a MR imaging agent, wherein said agent is a high $T_1$ agent and contains in its molecular structure at least two hyperpolarisable nuclei of the same type of MR imaging nuclei within the same molecule, having similar signal amplitudes, and wherein the frequency difference between the two resonance lines from said nuclei, $\delta\upsilon$, is dependent upon either the temperature, pH, $pO_2$, $pCO_2$, or ionic concentration of said sample;
   (ii) administering the nuclear spin polarised MR imaging agent to said sample;
   (iii) exposing said sample to a radiation at a frequency selected to excite nuclear spin transitions in selected nuclei therein;
   (iv) detecting and manipulating magnetic resonance signals from said sample using a single-shot RARE acquisition sequence with shifted data acquisition, and wherein and excitation and detection steps iii) and iv) are such that said nuclei are all being excited and detected in the same sequence; and
   (v) optionally generating an image, dynamic flow data, diffusion data or physiological and/or metabolic data from said detected signals.

2. A method as claimed in claim 1 wherein said hyperpolarisable nuclei in said high $T_1$ agent are two non-hydrogen spin ½ nuclei.

3. A method as claimed in claim 2 wherein said nuclei are two $^{13}C$ nuclei.

4. A method as claimed in claim 1 wherein said administration in step ii) is by bolus injection.

5. A method as claimed in claim 1 wherein said administration in step ii) is after said agent has undergone dissolution in a physiologically tolerable solvent.

6. A method as claimed in claim 1 wherein said administration in step ii) is after said agent is separated from some or all of the species providing the nuclear spin polarisation to said agent.

7. A method as claimed in claim 6 wherein at least 80% of the polarisation transferring material is removed.

8. A method as claimed in claim 1 wherein said radiation in step iii) is at a frequency selected to excite nuclear spin transitions in the spin polarised nuclei of said MR imagining agent.

9. A method as claimed in claim 1 wherein said high $T_1$ agent is water soluble.

10. A method as claimed in claim 1, wherein said $T_1$ value is 100 secs or more.

11. A method as claimed in claim 1, wherein said high $T_1$ agent contains said hyperpolarisable nuclei in an amount greater that isotopic abundance.

12. A method as claimed in claim 1 wherein $\delta\upsilon$ is dependent upon either the temperature or pH of the sample.

13. A method as claimed in claim 12 wherein said frequency difference in step i) is greater that 0.5 Hz per K or per 0.1 pH unit.

14. A method as claimed in claim 12 wherein said frequency difference in step i) is between 10 Hz and 50 Hz per K or per 0.1 pH unit.

15. A method as claimed in claim 1, wherein said MR imaging agent comprises $^{13}C$ nuclei at two particular positions in an amount in excess of natural abundance and wherein the $^{13}C$ nuclei amounts to $\geq 2\%$ of all carbon atoms in the agent.

16. A method as claimed in claim 15 wherein said $^{13}C$ nuclei are present in said agent at said positions to a level of enrichment in excess of 99%.

17. A method as claimed in claim 15, wherein said agent is $^{3}C$ enriched at carbonyl or quaternary carbon positions.

18. A method as claimed in 15, wherein said $^{13}C$ nuclei are surrounded by one or more non-MR active nuclei.

19. A method as claimed in claim 1 wherein the said at least two hyperpolarisable nuclei of the same type of MR imaging nuclei within the same molecule have the same signal amplitude.

20. A method of MR investigation of a sample previously administered with a nuclear spin polarised MR imaging agent formed by nuclear spin polarising a MR imaging agent, wherein said agent is a high $T_1$ agent and contains in its molecular structure at least two hyperpolarisable nuclei of the same type of MR imaging nuclei within the same molecule having similar signal amplitudes, and wherein the frequency difference between the two resonance lines from said nuclei, $\delta\upsilon$, is dependent upon either the temperature, pH, pO2, pCO2 or ionic concentration of said sample, said method comprising;
   i) exposing said sample to a radiation at a frequency selected to excite nuclear spin transitions in selected nuclei therein;
   ii) detecting and manipulating magnetic resonance signals from said sample using a single-shot RARE acquisition sequence with shifted data acquisition, and wherein the exposing and detecting steps are such that said nuclei are all being excited and detected in the same sequence; and
   iii) optionally generating an image, dynamic flow data, diffusion data or physiological and/or metabolic data from said detected signals.

* * * * *